US010826266B2

(12) United States Patent
Liu et al.

(10) Patent No.: US 10,826,266 B2
(45) Date of Patent: Nov. 3, 2020

(54) REFRIGERATION STRUCTURE OF SEMICONDUCTOR LASER, AND SEMICONDUCTOR LASER AND STACK THEREOF

(71) Applicant: Focuslight Technologies Inc., Xi'an (CN)

(72) Inventors: Xingsheng Liu, Xi'an (CN); Dongshan Yu, Xi'an (CN); Xuejie Liang, Xi'an (CN); Linbo Zhang, Xi'an (CN); Yangtao Jia, Xi'an (CN)

(73) Assignee: Focuslight Technologies Inc., Xi'an (CN)

( * ) Notice: Subject to any disclaimer, the term of this patent is extended or adjusted under 35 U.S.C. 154(b) by 88 days.

(21) Appl. No.: 16/081,457

(22) PCT Filed: Apr. 24, 2017

(86) PCT No.: PCT/CN2017/081697
§ 371 (c)(1),
(2) Date: Aug. 31, 2018

(87) PCT Pub. No.: WO2017/182005
PCT Pub. Date: Oct. 26, 2017

(65) Prior Publication Data
US 2020/0028321 A1   Jan. 23, 2020

(30) Foreign Application Priority Data
Apr. 22, 2016 (CN) .......................... 2016 1 0256531
Apr. 22, 2016 (CN) .......................... 2016 1 0256791

(51) Int. Cl.
*H01S 5/024* (2006.01)

(52) U.S. Cl.
CPC ...... *H01S 5/02423* (2013.01); *H01S 5/02476* (2013.01); *H01S 5/02461* (2013.01)

(58) Field of Classification Search
CPC ............. H01S 5/02423; H01S 5/02476; H01S 5/02461; H01S 5/02276
See application file for complete search history.

(56) References Cited

U.S. PATENT DOCUMENTS 5,105,430 A * 4/1992 Mundinger ......... H01S 5/02423
372/35
6,643,302 B1 * 11/2003 Nishikawa ............ F28D 9/0043
372/34

(Continued)

FOREIGN PATENT DOCUMENTS

CN   105703213 A   6/2016
CN   105703214 A   6/2016

(Continued)

*Primary Examiner* — Yuanda Zhang
(74) *Attorney, Agent, or Firm* — IPro, PLLC

(57) ABSTRACT

Disclosed herein is a cooler of a semiconductor laser. The cooler includes a heat sink comprising a first surface and a second surface opposite the first surface; a first conductive layer and a second conductive layer, disposed on the first surface and not short-circuited to each other; and a conductive connector comprising a first end part, a second end part, and a first connection part connecting the first end part and the second end part. The first end part is on the first conductive layer. The second end part is on the second surface of the heat sink and insulated from the heat sink. The first connection part is disposed at a first non-opposite end of the first conductive layer on the heat sink.

8 Claims, 10 Drawing Sheets

(56) References Cited

U.S. PATENT DOCUMENTS

| | | | |
|---|---|---|---|
| 9,001,856 B1 | 4/2015 | Govorkov et al. | |
| 2005/0141575 A1 | 6/2005 | Lorenzen | |
| 2006/0262819 A1* | 11/2006 | Treusch | H01S 5/02423 |
| | | | 372/34 |
| 2007/0291803 A1* | 12/2007 | Crum | H01S 5/4025 |
| | | | 372/34 |

FOREIGN PATENT DOCUMENTS

| | | |
|---|---|---|
| CN | 205622042 U | 10/2016 |
| CN | 205724361 U | 11/2016 |
| WO | 2016063814 A1 | 4/2016 |

* cited by examiner

REFRIGERATION STRUCTURE OF SEMICONDUCTOR LASER, AND SEMICONDUCTOR LASER AND STACK THEREOF

The present disclosure claims priority to Chinese Patent Application No. CN201610256531.6, filed with the Chinese Patent Office on Apr. 22, 2016, titled "LIQUID COOLED SEMICONDUCTOR LASER COMPRISING INSULATED HEAT SINK AND STACK THEREOF," and to Chinese Patent Application No. CN201610256791.3, filed with the Chinese Patent Office on Apr. 22, 2016, titled "LIQUID COOLED SEMICONDUCTOR LASER COMPRISING INSULATING HEAT SINK." The contents of all of the aforementioned applications, including any intervening amendments thereto, are incorporated herein by reference.

FIELD OF THE INVENTION

The disclosure belongs to the field of lasers, and more particularly to a cooler of the semiconductor laser, a semiconductor laser comprising the cooler, and a stack of the semiconductor lasers.

BACKGROUND OF THE INVENTION

Conventional packaging structures of the semiconductor lasers include two categories: liquid cooling type and conductive cooling type. Limited by the heat dissipation efficiency, the conductive cooling type packaging structure is difficult to use in high power devices. Currently, the liquid cooled packaging structure is the main choice to manufacture high power devices.

The packaging structure of liquid cooled semiconductor lasers mainly includes two types: microchannel and macrochannel:

1) Liquid-cooled semiconductor laser with microchannel: the heat dissipation of the heat sink with microchannel is good (because a plurality of tiny heat dissipation channels is disposed inside), higher power can be realized, but because the heat sink works in the charged state, the electrochemical corrosion tends to occur, which causes the problem of channel blockage after long-term use; in addition, the heat sink with microchannel poses high requirements for liquid water quality. Once the tap water is used or the water change is not timely, the semiconductor laser tends to break down.

2) Liquid-cooled semiconductor laser with macrochannel: the heat sink with macrochannel has a large liquid passage, which can effectively solve the problem of blockage of the heat sink; however, limited to the heat dissipation efficiency, the liquid-cooled semiconductor laser cannot be used in high power devices. The internal passage of the heat sink is large, which reduces the water quality requirements. However, because the heat sink works in the charged state, if the water quality is too bad (such as tap water), the semiconductor laser will break down due to the metal oxide obstructions caused by the electrochemical reaction during use.

The heat sinks of the above two types of semiconductor lasers all work in the charged state, and in use, the electrochemical reaction of the refrigerating liquid produces metal oxides which tend to block and invalid the heat sinks.

SUMMARY OF THE INVENTION

In view of the above-described problems, it is one objective of the invention to provide a cooler of the semiconductor laser, a semiconductor laser comprising the cooler, and a stack of the semiconductor lasers, all of which can be applied to high power devices, and have high environmental adaptability and reliability.

To achieve the above objective, the following technical solutions are adopted.

A cooler of a semiconductor laser, comprises: a heat sink comprising a liquid cooling circuit and an upper surface, a first insulation layer disposed on the upper surface of the heat sink, and a first electrical and thermal conductive layer disposed on the first insulation layer; a laser chip and a negative conductive layer are disposed on different positions of the first electrical and thermal conductive layer; a positive surface of the laser chip is directly bonded on the first electrical and thermal conductive layer; an insulating interlayer is disposed between the negative conductive layer and a surface of the first electrical and thermal conductive layer; and the negative conductive layer is connected to a negative surface of the laser chip; or, the first electrical and thermal conductive layer comprises a positive area and a negative area which are insulated from each other; the laser chip comprises a positive surface and a negative surface, the positive surface is bonded to the positive area, and the negative surface is connected to the negative area.

A cooler of a semiconductor laser, comprises: a heat sink comprising an upper surface and a lower surface which are correspondingly disposed; a positive conductive layer and a negative conductive layer which are disposed on the upper surface and insulated from each other, the positive conductive layer being designed to receive a laser chip and being electrically connected to a positive pole of the laser chip, and the negative conductive layer being connected to a negative pole of the laser chip disposed on the positive conductive layer; and a conductive connector comprising a first end part, a second end part, and a first connection part connecting the first end part and the second end part; the first end part being disposed on the positive conductive layer, the second end part being disposed on the second surface of the heat sink and being insulated from the heat sink; and the first connection part being disposed at a non-opposite end of the positive conductive layer on the heat sink.

A semiconductor laser, comprises a laser chip and the aforesaid cooler of a semiconductor laser. The laser chip is disposed on and electrically connected to a first part of the cooler of the semiconductor laser on which the laser chip is disposed, and a negative pole of the laser chip is electrically connected to a second part of the cooler of the semiconductor laser to which the negative pole of laser chip is connected.

A stack of semiconductor lasers, comprises a plurality of semiconductor lasers. The plurality of semiconductor lasers is sequentially arranged along the slow axis of the laser chip, or the plurality of semiconductor lasers is sequentially stacked along the fast axis of the laser chip.

Advantages of the invention are summarized as follows:

1. The liquid cooler is employed, which satisfies the heat dissipation requirement of the high-power device, and the heat sink is electrically insulated; the connection surface of the electrode and the cooler is insulated by an insulating layer, thereby ensuring that the microchannels of the cooler are completely insulated during operation, avoiding electrochemical corrosion.

2. The laser chip does not directly contact the heat sink, which reduces the stress of the chip and saves the process of disposing the copper-tungsten release layer.

3. The positive and negative electrical connections under the premise of heat sink insulation are more reliable, especially the designed U-shaped connection piece has a simple structure, is convenient to use, and is very suitable for reliable use in semiconductor lasers. In the vertical stack structure, how to realize the electrical connection of the upper and lower coolers is a technical difficulty. In the present application, through the creative design of the U-shaped connection piece, the insulated cooler can be directly applied to the vertical stacked structure. Based on the U-shaped connection piece, the positive of each cooler is closely coupled with the negative of the cooler located thereon, and the insulating layer and the cooler are insulated through an insulation interlayer, which does not affect the characteristics of the electrical isolation of the cooler.

Figure 1:
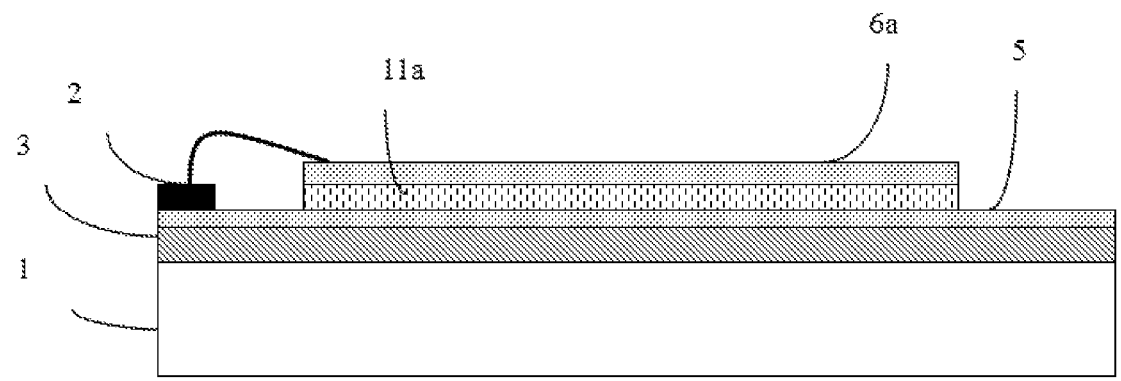
FIG. 1 is a basic structural diagram of a first embodiment of the invention.

In the drawings, the following reference numbers are used: 1. Heat sink; 2. Laser chip; 3. First insulation layer; 4. Second insulation layer; 5. First electrical and thermal conductive layer; 6a. Negative conductive layer; 7. U-shaped connection piece; 8. Conductive pipe; 9. Second electrical and thermal conductive layer; 10. Gold wire; 11a. Insulation interlayer; 51. Positive area; 52. Negative area; 6b. Insulation cushion; 11b. Insulation block separating positive area and negative area; 100. Cooler of semiconductor laser; 110. Heat sink; 111. First surface of heat sink; 112. Second surface of heat sink; 120. Positive conductive layer; 130. Negative conductive layer; 140. Conductive conductor; 150. First insulation layer; 152. Third insulation layer; 154. Second insulation layer; 156. Fourth insulation layer; 142. First connection part of conductive conductor; 146. First end part; 148. Second end part; 146b. Third conductive conductor; 142b. Second connection part; 200. Semiconductor laser; 210. Laser chip; 300. Semiconductor laser stack.

DETAILED DESCRIPTION OF THE EMBODIMENTS

The technical schemes in the embodiments of the disclosure will be described clearly and completely below in conjunction with the drawings of the disclosure. Obviously, the described embodiments are only one part of the disclosure, not all of the embodiments. The components of the embodiment of the disclosure, which are generally described and illustrated in the drawings herein, may be arranged and designed in various configurations. Accordingly, the following detailed description of the embodiments of the disclosure provided in the drawings is not intended to limit the scope of the application for protection, but merely represents the selected embodiments of the disclosure. Based on the embodiments of this application, all other embodiments acquired by a person skilled in the art without performing creative work fall within the scope of this application.

It should be noted that similar reference numerals and letters indicate similar items in the following figures, and therefore, once an item is defined in a drawing, it is not necessary to further define and explain it in the subsequent drawings. Meanwhile, in the description of the disclosure, the terms "first", "second", etc. are used only to distinguish descriptions, and are not to be construed as indicating or implying relative importance.

Embodiment 1

As shown in FIG. 1, a cooler of a semiconductor laser of the disclosure comprises a heat sink 1, a first insulation layer 3, a first electrical and thermal conductive layer 5, and a negative conductive layer 6a. The heat sink may be a liquid refrigerator having a liquid cooling circuit therein, and the negative conductive layer may be a negative copper piece. Of course, the heat sink and the negative conductive layer are not specifically defined in this embodiment. The cooler of the semiconductor laser can be equipped with a laser chip to manufacture a semiconductor laser.

Specifically, the heat sink comprises an upper surface and a lower surface. The first insulation layer is disposed on the upper surface to insulate the heat sink and the laser chip. The first electrical and thermal conductive layer 5 is disposed on the first insulation layer. The laser chip and the negative conductive layer are disposed on different positions of the first electrical and thermal conductive layer. The positive surface of the laser chip is directly bonded on the first electrical and thermal conductive layer. An insulating interlayer is disposed between the negative conductive layer and the surface of the first electrical and thermal conductive layer, to insulate the negative conductive layer and the first electrical and thermal conductive layer. The negative conductive layer can be connected to the negative surface of the laser chip through a gold wire, and, of course, it can also be connected to the negative surface of the laser chip in other ways. In this embodiment, the negative conductive layer of the semiconductor laser can be a negative copper sheet, and the first conductive thermal conductive layer acts as the positive conductive layer of the semiconductor laser. The position of the first conductive thermal conductive layer for receiving the laser chip can be the area where no negative conductive layer is disposed on the first conductive thermal conductive layer. Of course, in the present embodiment, the negative conductive layer is not limited to a copper sheet, and may also be a conductive layer made of other conductive materials in other forms.

It can be understood that the "upper" and "lower" of the upper and lower surfaces in this embodiment are relative concepts, and not defined by absolute orientation. The upper surface and the lower surface are two opposite surfaces, that is, the lower surface of the heat sink is a surface that is far from the upper surface.

Preferably, the heat sink is made of copper, the first electrical and thermal conductive layer is made of a copper foil, and the first insulation layer 3 is integrated with the first electrical and thermal conductive layer 5, for example, in a Direct Bonded Copper (DBC) or a Direct Plate Copper (DPC) structure. The first insulation layer 3 can employ aluminum nitride ceramic or beryllium oxide ceramic. Optionally, in the embodiment, the materials of the heat sink, the first electrical and thermal conductive layer and the first insulation layer are not limited, and may be other materials, for example, the heat sink may be ceramic, diamond, copper diamond composite materials, or the like. The first electrical and thermal conductive layer may also be other electrical and thermal conductive materials, such as iron, etc., and the first electrical and thermal conductive layer may also be in other forms.

Figure 2:
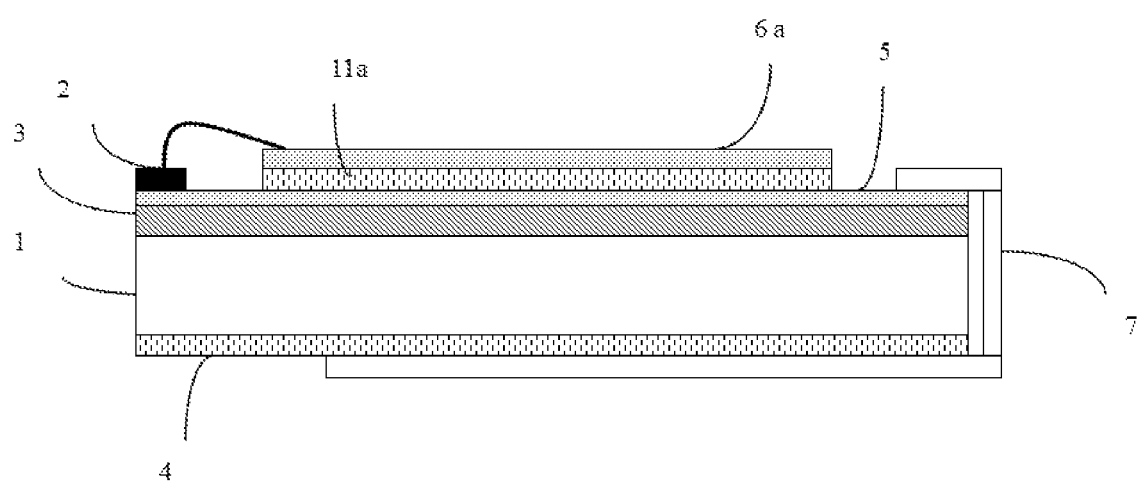
FIG. 2 is a schematic diagram of a first embodiment of the invention.
Figure 3:
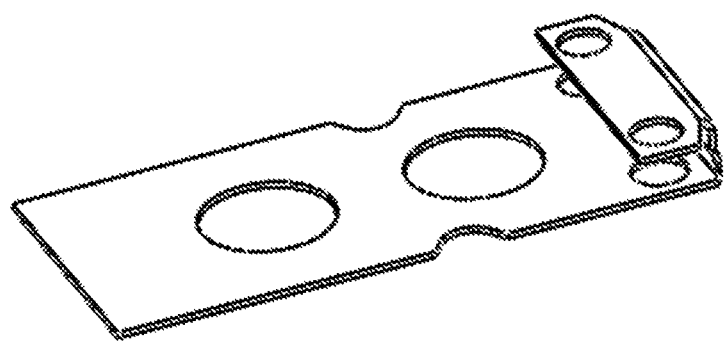
FIG. 3 is a schematic diagram of a U-shaped connection piece according to one embodiment of the invention.
Figure 4:
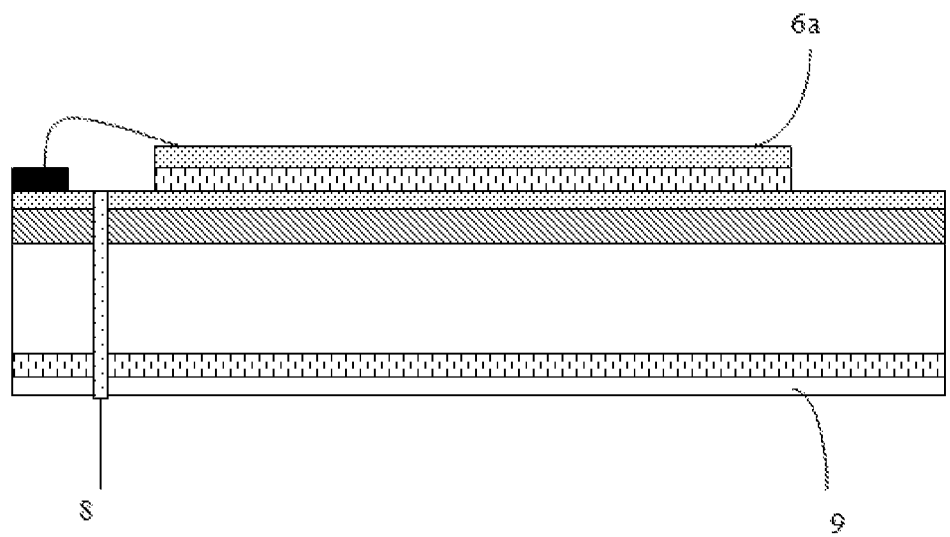
FIG. 4 is a schematic diagram of a first embodiment of the invention.
Figure 5:
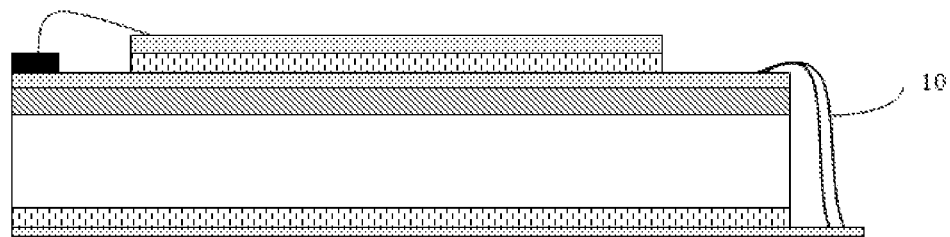
FIG. 5 is a schematic diagram of a first embodiment of the invention.

The semiconductor laser comprising the cooler can be a primary unit of a stack of semiconductor lasers. For a single semiconductor laser, the positive and negative conductive layers can be directly connected to a power supply. For a stack of a plurality of semiconductor lasers, to facilitate the implementation of the stack structure, as shown in FIG. 2, a second insulation layer 4 can be disposed on the lower surface of the heat sink, and a second electrical and thermal conductive layer is disposed on the second insulation layer. The second insulation layer insulates the heat sink and the second electrical and thermal conductive layer. The second electrical and thermal conductive layer is connected to the first electrical and thermal conductive layer via a conductive connector so that the upper part and the lower part of the liquid refrigerator are electrically connected. The electrical connection has at least the following three preferred structures:

1) a U-shaped connection piece as shown in FIGS. 2 and 3;

2) as shown in FIG. 4, a conductive pipe 8 is employed to connect the first electrical and thermal conductive layer and the second electrical and thermal conductive layer 9 therebelow, and the conductive pipe is insulated from the heat sink;

3) As shown in FIG. 5, the first electrical and thermal conductive layer communicates with the second electrical and thermal conductive layer 9 therebelow via a gold wire 10. Considering that the DBC structure of the first insulation layer is costly, the second insulation layer can adopt inexpensive polyimide (PI) insulating material.

Specifically, corresponding to various electrical connection modes, in a specific embodiment, as shown in FIG. 2, the conductive connector may adopt a U-shaped connection piece structure. The U-shaped connection piece comprises two parallel straight parts and a bended end part connecting the two parallel straight parts. The second electrical and thermal conductive layer acts as a second parallel straight part of the U-shaped connection piece and is bonded on the surface of the second insulation layer, and a first parallel straight part of the U-shaped connection piece is bonded on the surface of the first electrical and thermal conductive layer. Specifically, the bonding position may be a surface of the first electrical and thermal conductive layer for receiving the laser chip, and preferably, the laser chip disposed at the first electrical and thermal conductive layer is not in direct contact with the first parallel straight part of the U-shaped connection piece. Optionally, the second parallel straight part of the U-shaped connection piece can be an electrical and thermal conductive end straight part disposed on the surface of the second electrical and thermal conductive layer.

Specifically, the U-shaped connection piece and the laser chip are disposed at two ends of the heat sink, respectively; suppose a connection line of the U-shaped connection piece and the laser chip is an axial direction, the bended end part of the U-shaped connection piece is disposed in such a direction that enables an opening direction of the U-shaped connection piece to face the axial direction.

In other certain embodiments, as shown in FIG. 4, the conductive connector is an internal connection passage running through the heat sink from the first electrical and thermal conductive layer to the second electrical and thermal conductive layer; a conducting medium is disposed in the internal connection passage, or the internal connection passage is conductive, thus enabling the first electrical and thermal conductive layer to electrically connect to the second electrical and thermal conductive layer.

In other certain embodiments, as shown in FIG. 5, the conductive connector is a flexible electrical connection strip or a gold wire; the conductive connector and the laser chip are disposed at two ends of the liquid refrigerator, respectively; that is, the conductive connector of the semiconductor laser of the embodiment and the laser chip are correspondingly disposed at two ends of the liquid refrigerator, respectively; the second electrical and thermal conductive layer extends beyond the heat sink along an end plane of the conductive connector; the conductive connector extends from the first electrical and thermal conductive layer, bypasses the heat sink, and connects to a part of the second electrical and thermal conductive layer that extends beyond the liquid refrigerator.

As an improvement, the conductive connector extends from the first electrical and thermal conductive layer, bypasses the heat sink, and connects to the part of the second electrical and thermal conductive layer that extends beyond the heat sink. Preferably, the conductive connector extends from an area of the first electrical and thermal conductive layer on which the laser chip is disposed, bypasses the heat sink, and connects to a part of the second electrical and thermal conductive layer, so that when the laser chip is disposed on the first electrical and thermal conductive layer, the conductive connector can be electrically connected to the positive pole of the laser chip. In this embodiment, the second electrical and thermal conductive layer may not extend beyond the heat sink along the end plane of the conductive connector, and the first and second electrical and thermal conductive layers are electrically connected directly through a flexible conductive connector. It is understood that the material of the conductive connector in the present embodiment is not limited to that being disclosed, just to satisfy the flexible conduction, so that the first electrical and thermal conductive layer and the second electrical and thermal conductive layer can be electrically connected.

In certain embodiments, the first insulation layer, the second insulation layer and the insulating interlayer are made of aluminum nitride ceramic, beryllium oxide ceramic, or polyimide. Specifically, the first insulation layer, the second insulation layer, the insulating interlayer and other insulation medium involved in the disclosure can be the same material or different materials.

The cooler of a semiconductor laser of the invention can be used to prepare a semiconductor laser. The semiconductor laser comprises the cooler and a laser chip 2. The laser chip and the negative conductive layer are disposed on different positions of the first electrical and thermal conductive layer. The formed semiconductor laser can be a liquid cooled semiconductor laser.

Employing the semiconductor laser as a basic unit, a stack of semiconductor lasers can be assembled. Specifically, a plurality of semiconductor lasers is sequentially arranged along the slow axis of the laser chip, or a plurality of semiconductor lasers is sequentially stacked along the fast axis of the laser chip.

One optional connection form is that the negative conductive layer of the semiconductor laser at the top of the stack is connected to the negative pole of the power supply, and the first electrical and thermal conductive layer of the semiconductor laser at the bottom of the stack is connected to the positive pole of the power supply, and the stacked semiconductor lasers are connected in series or in parallel.

Specifically, the semiconductor laser stacks can be divided into two assembly forms: horizontal arrays and vertical stacks:

1) horizontal arrays: a plurality of semiconductor lasers is sequentially arranged along the slow axis of the laser chip, and each semiconductor laser is independently connected to the power supply, or the first electrical and thermal conductive layer 5 and the negative conductive layer 6a are respectively connected in parallel, and then connected to the power supply;

2) Vertical stacks: a plurality of semiconductor lasers is sequentially stacked along the fast axis of the laser chip; the negative conductive layer 6a is connected in series to the second electrical and thermal conductive layer 9 of an adjacent semiconductor laser.

Take the structure in FIG. 2 as an example, the semiconductor laser of the disclosure is prepared as follows:

1. The heat sink has the same structure as an existing liquid cooling cooler, and has a liquid cooling circuit.

2. The chip is fixed on the surface of the DPC using a gold-tin solder (since the thermal expansion coefficient of AlN is close to the GaAs material of the chip, hard solder can be used).

3. Fixing the DPC carrying the chip with the cooler by means of solder reflow (low melting point).

4. The negative electrode and the U-shaped electrode are cured by a thermosetting PI material (polyimide) at a temperature of about 150° C. and tightly bonded.

5. Finally, the N-side and the negative electrode of the chip are connected by a gold wire bonding method.

Thus, a semiconductor laser is assembled.

The aforesaid semiconductor laser can be used as a basic unit to prepare a stack. It can be assembled by a simple mechanical structure, sealed with a rubber seal, and achieves electrical connection through a U-shaped electrode.

Embodiment 2

Figure 6:
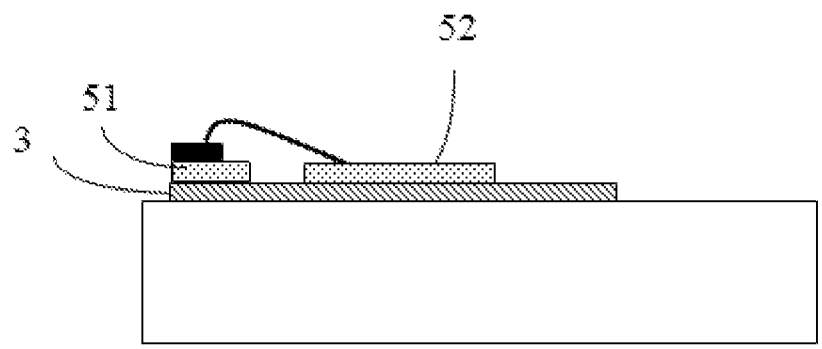
FIG. 6 is a basic structural diagram of a second embodiment of the invention.

As shown in FIG. 6, a cooler of a semiconductor laser of the disclosure comprises a heat sink, a first insulation layer, and a first electrical and thermal conductive layer. The heat sink may be a liquid refrigerator having a liquid cooling circuit therein, and the negative conductive layer may be a negative copper piece.

The first insulation layer is disposed on the upper surface of the heat sink. The first electrical and thermal conductive layer is disposed on the first insulation layer. The first electrical and thermal conductive layer on the first insulation layer comprises two mutually insulated areas, that is, a positive area 51 and a negative area 52. The positive area is bonded to the positive surface of the laser chip, and the negative area is connected to the negative surface of the laser chip. Specifically, the positive area functions as a positive conductive layer, and the negative area functions as a negative conductive layer. When the laser chip is bonded on the positive area, the first insulation layer insulates the heat sink from the laser chip.

Specifically, the positive area and the negative area are two spaced apart areas divided by the first electrical and thermal conductive layer; a gap exists between the positive area and the negative area, or the positive area and the negative area are separated by an insulating medium.

Preferably, the heat sink is made of copper, the first electrical and thermal conductive layer is made of a copper foil, and the first insulation layer 3 is integrated with the first electrical and thermal conductive layer 5, for example, in a Direct Bonded Copper (DBC) or a Direct Plate Copper (DPC) structure. The first insulation layer 3 can employs aluminum nitride ceramic or beryllium oxide ceramic. Optionally, in the embodiment, the materials of the heat sink, the first electrical and thermal conductive layer and the first insulation layer are not limited, and may be other materials, for example, the heat sink may be ceramic, diamond, copper diamond composite materials, or the like. The first electrical and thermal conductive layer may also be other electrical and thermal conductive materials, such as iron, etc., and the first electrical and thermal conductive layer may also be in other forms.

Figure 7:
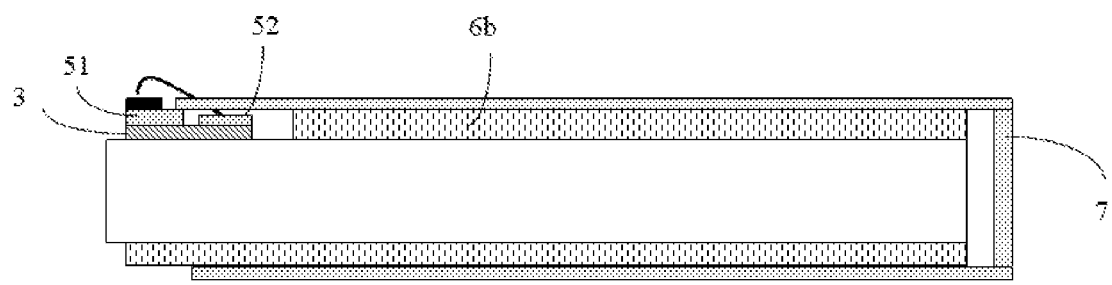
FIG. 7 is a schematic diagram of a second embodiment of the invention (front view)
Figure 8:
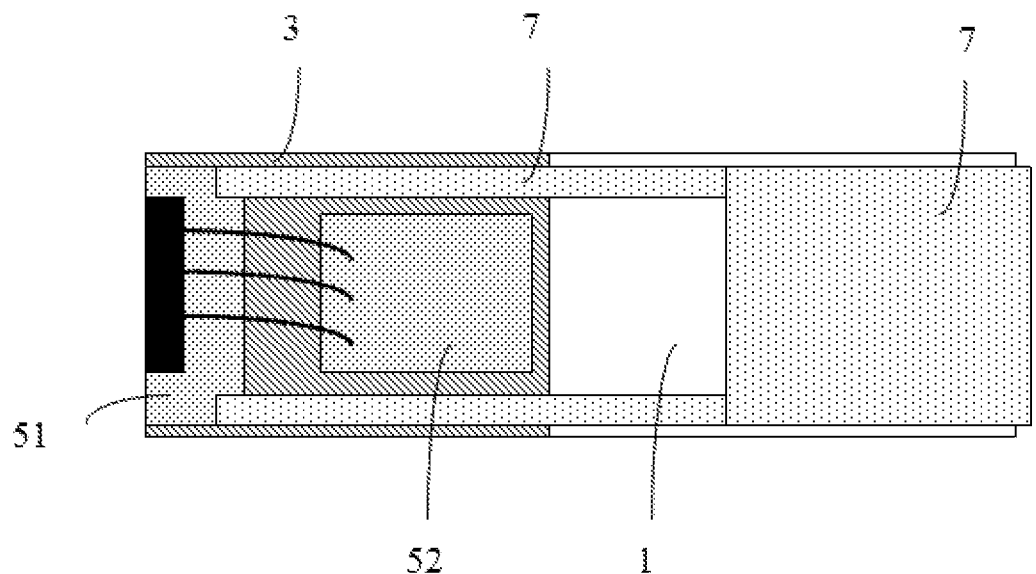
FIG. 8 is a schematic diagram of a second embodiment of the invention (top view)
Figure 9:
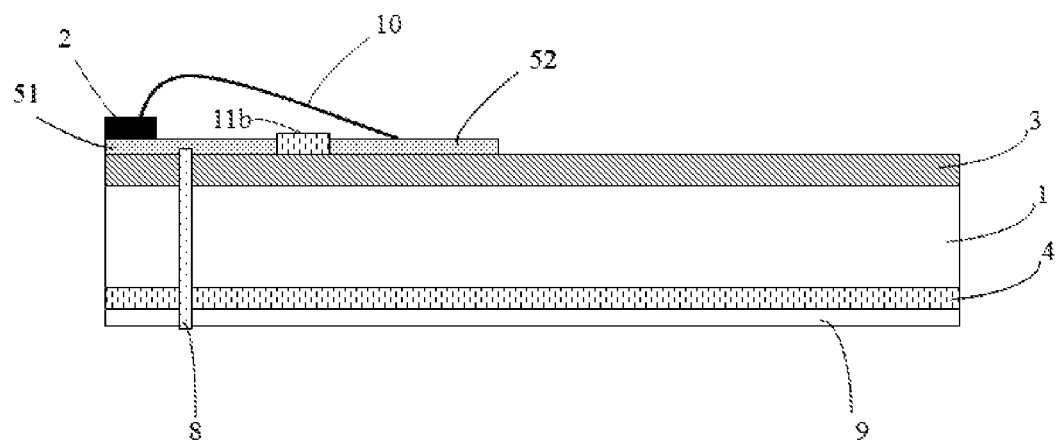
FIG. 9 is a schematic diagram of a second embodiment of the invention.

The semiconductor laser comprising the cooler can be a primary unit of a stack of semiconductor lasers. For a single semiconductor laser, the positive area and the negative area can be directly connected to a power supply. For a stack of a plurality of semiconductor lasers, to facilitate the implementation of the stack structure, a second insulation layer 4 can be disposed on the lower surface of the heat sink, and a second electrical and thermal conductive layer is disposed on the second insulation layer. The second insulation layer insulates the heat sink and the second electrical and thermal conductive layer. The second electrical and thermal conductive layer is connected to the first electrical and thermal conductive layer via a conductive connector so that the upper part and the lower part of the liquid refrigerator are electrically connected. The electrical connection has at least the following two preferred structures:

1) a U-shaped connection piece as shown in FIGS. 7 and 8;

2) As shown in FIG. 9, a conductive pipe 8 is employed to connect the first electrical and thermal conductive layer 5 and the second electrical and thermal conductive layer 9 therebelow, and the conductive pipe is insulated from the heat sink.

Considering that the DBC structure of the first insulation layer is costly, the second insulation layer can adopt inexpensive polyimide (PI) insulating material.

Specifically, corresponding to various electrical connection modes, in a specific embodiment, as shown in FIG. 7, the conductive connector may adopt a U-shaped connection piece structure. The U-shaped connection piece comprises two parallel straight parts and a bended end part connecting the two parallel straight parts. The second electrical and thermal conductive layer acts as a second parallel straight part of the U-shaped connection piece and is bonded on the surface of the second insulation layer, and a first parallel straight part of the U-shaped connection piece is bonded on the surface of the first electrical and thermal conductive layer where the laser chip is disposed. The specific bonding position can be a region of the position area where no laser chip is disposed and does not contact the negative surface. Optionally, the second parallel straight part of the U-shaped connection piece can be an electrical and thermal conductive end straight part disposed on the surface of the second electrical and thermal conductive layer.

Specifically, the U-shaped connection piece and the positive area are preferably disposed at two ends of the heat sink, respectively. That is to say, when the cooler of the disclosure and the laser chip are employed to prepare the semiconductor laser, the U-shaped connection piece and the laser chip are preferably disposed at two ends of the liquid refrigerator, respectively. Suppose a connection line of the U-shaped connection piece and the laser chip is an axial direction, the bended end part of the U-shaped connection piece is disposed in such a direction that enables an opening direction of the U-shaped connection piece to face the axial direction.

In other certain embodiments, as shown in FIG. 9, the conductive connector is an internal connection passage running through the heat sink from the first electrical and thermal conductive layer to the second electrical and thermal conductive layer; a conducting medium is disposed in the internal connection passage, or the internal connection passage is conductive, thus enabling the first electrical and thermal conductive layer to electrically connect to the second electrical and thermal conductive layer.

In certain embodiments, the insulation materials involved in the disclosure can be any one of aluminum nitride ceramic, beryllium oxide ceramic, and polyimide. The first electrical and thermal conductive layer employs a copper foil. "Any one of" means that the first insulation layer, the second insulation layer, the insulating interlayer and other insulation medium involved in the disclosure can be the same material or different materials.

The cooler of a semiconductor laser of the invention can be used to prepare a semiconductor laser. The semiconductor laser comprises the cooler and a laser chip. The positive surface of the laser chip is directly bonded on the positive area, and the negative surface of the laser chip is connected to the negative area via a gold wire. Optionally, the electrical connection modes of the negative surface of the laser chip to the negative area are not limited to those disclosed.

Employing the semiconductor laser as a basic unit, a stack of semiconductor lasers can be assembled. Specifically, a plurality of semiconductor lasers is sequentially arranged along the slow axis of the laser chip, or a plurality of semiconductor lasers is sequentially stacked along the fast axis of the laser chip.

One optional connection form is that the negative conductive layer of the semiconductor laser at the top of the stack is connected to the negative pole of the power supply, and the first electrical and thermal conductive layer of the semiconductor laser at the bottom of the stack is connected to the positive pole of the power supply, and the stacked semiconductor lasers are connected in series or in parallel.

Specifically, the semiconductor laser stacks can be divided into two assembly forms: horizontal arrays and vertical stacks:

1) horizontal arrays: a plurality of semiconductor lasers is sequentially arranged along the slow axis of the laser chip, and each semiconductor laser is independently connected to the power supply, or the positive area and the negative area are respectively connected in parallel, and then connected to the power supply;

2) Vertical stacks: a plurality of semiconductor lasers is sequentially stacked along the fast axis of the laser chip; the negative area is connected in series to the second electrical and thermal conductive layer of an adjacent semiconductor laser.

The semiconductor laser of the disclosure is prepared as follows:

1. The heat sink has the same structure as an existing liquid cooling cooler, and has a liquid cooling circuit.
2. The chip is fixed on the surface of the DPC using a gold-tin solder (since the thermal expansion coefficient of AlN is close to the GaAs material of the chip, hard solder can be used).
3. Fixing the DPC carrying the chip with the cooler by means of solder reflow (low melting point).
4. The first electrical and thermal conductive layer (the positive area and the negative area) are cured by a thermosetting PI material (polyimide) at a temperature of about 150° C. and tightly bonded.
5. Finally, the N-side and the negative electrode of the chip are connected by a gold wire bonding method.

Thus, a semiconductor laser is assembled.

The aforesaid semiconductor laser can be used as a basic unit to prepare a stack. It can be assembled by a simple mechanical structure, sealed with a rubber seal, and achieves electrical connection through a U-shaped electrode.

Embodiment 3

Figure 10:
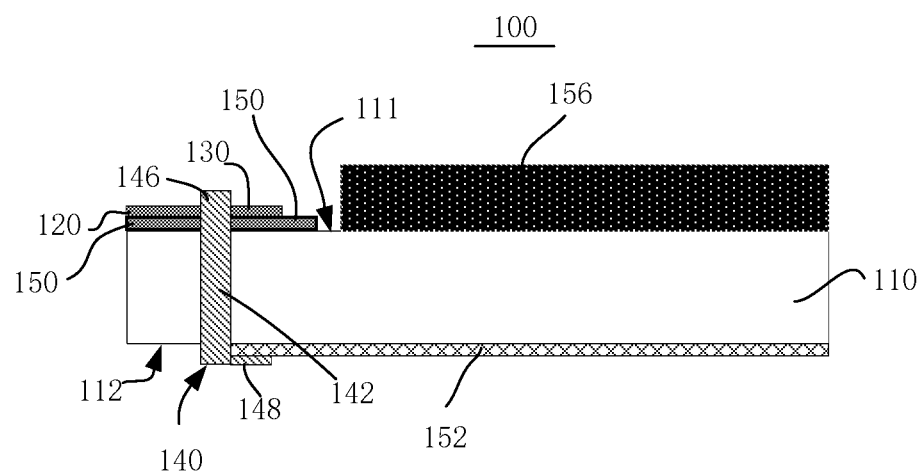
FIG. 10 is a schematic diagram of a cooler of a semiconductor laser of a third embodiment of the invention at a first angle of view.

FIG. 10 shows a cooler 100 of a semiconductor laser of the disclosure. As shown in FIG. 10, the cooler 100 of the disclosure comprises a heat sink 110, a positive conductive layer 120, a negative conductive layer 130 and a conductive conductor 140.

As shown in FIG. 10, the heat sink comprises an upper surface and a lower surface which are correspondingly disposed, and a side surface connecting the upper surface and the lower surface. It should be noted that the "upper" and "lower" of the upper and lower surfaces do not represent an absolute orientation. In this example, the upper surface is a first surface 111 and the lower surface is a second surface 112. The first surface 111 and the second surface 112 may be rectangular, having relatively long sides and relatively short sides, and the longer sides and the shorter sides are adjacent to each other. Optionally, the first surface and the second surface of the heat sink may also be other shapes, such as a square. If the first surface and the second surface are square, the longer side and the shorter side are adjacent two sides. The positive conductive layer 120 and the negative conductive layer 130 are disposed on the first surface 111 of the heat sink 110 and are insulated from each other. In addition, the positive conductive layer and the negative conductive layer are insulated from the heat sink. The conductive connector 140 extends from the positive conductive layer 120 to the second surface 112 of the heat sink 110 to connect the positive conductive layer 120 and the second surface.

Specifically, in certain embodiments of the disclosure, the heat dissipation of the heat sink 110 can be of a liquid cooling type. If the heat sink 110 is a liquid cooling type, the heat sink 110 may be a liquid refrigerator and has a liquid cooling circuit inside. The heat sink 110 can be made of an insulating, high thermal conductivity material such as ceramic, diamond, copper diamond composite, etc. The heat sink 110 may also be made of non-insulating material, and a first insulation layer 150 is disposed on the first surface 111 of the heat sink 110. The first insulation layer 150 is located between the first surface 111 and the positive conductive layer 120 and the negative conductive layer 130 to insulate the heat sink 110 and the positive conductive layer 120 and the negative conductive layer 130, as shown in FIG. 10. As an improvement, a third insulation layer 152 is disposed on the second surface 112 of the heat sink 110 to insulate the second surface 112 of the heat sink 110 from the outside, and when the semiconductor lasers prepared by the cooler form a stack, the heat sinks of the semiconductor lasers can be insulted from the semiconductor lasers.

If the heat sink 110 is made of an insulating material, the positive conductive layer and the negative conductive layer may be directly disposed on the first surface of the heat sink, and the heat sink and the positive conductive layer and the negative conductive layer are in an insulated state, and the first insulation layer 150 and third insulation layer 152 are not required. Optionally, if the heat sink 110 is made of an insulating material, the first surface 111 of the heat sink 110 may also be provided with the first insulation layer 150 between the heat sink 110 and the positive conductive layer 120 and the negative conductive layer 130, and the second surface 112 of the heat sink 110 may also be provided with the third insulation layer 152.

In certain embodiments, the heat sink 110, the first insulation layer 150, and the third insulation layer 152 may be an integrated structure, or the heat sink 110, the first insulation layer 150, the third insulation layer 152, the positive conductive layer 120 and the negative conductive layer 130 form an integrated structure.

In certain embodiments, the positive conductive layer 120 is designed to receive a laser chip and is electrically connected to a positive electrode of the laser chip, and the negative conductive layer 130 is designed to be electrically connected to a negative electrode of the laser chip disposed on the positive conductive layer 120.

Figure 11:
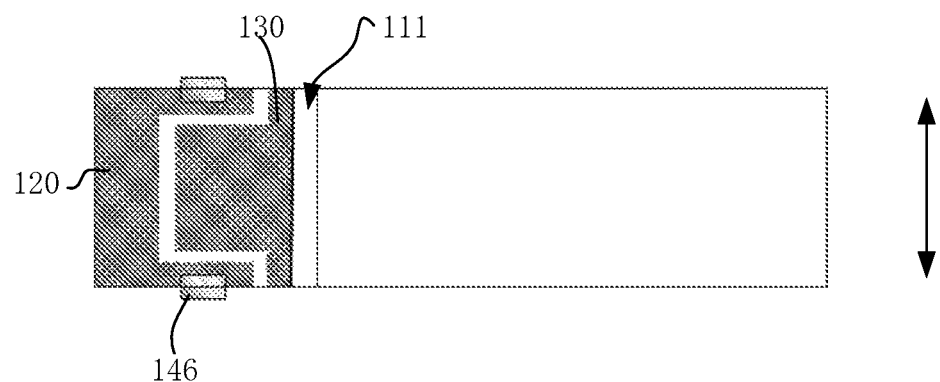
FIG. 11 is a schematic diagram of a cooler of a semiconductor laser of a third embodiment of the invention at a second angle of view.

Specifically, the positive conductive layer 120 and the negative conductive layer 130 may be disposed in the same layer, and are two mutually spaced and independent conductive regions, and the positive conductive layer 120 and the negative conductive layer 130 have a certain interval, as shown in FIG. 11. The arrangement manner is similar to that of the positive area and the negative area in the second embodiment. Specifically, the positive conductive layer 120 and the negative conductive layer 130 may be formed by disposing a first electrical and thermal conductive layer on the first surface 111 of the heat sink 110, and dividing the first electrical and thermal conductive layer into two regions spaced apart from each other to yield the positive conductive layer 120 and the negative conductive layer 130. Furthermore, a gap exists between the positive conductive layer 120 and the negative conductive layer 130, or the positive conductive layer 120 and the negative conductive layer 130 are separated by an insulating medium, to ensure the insulation of the positive conductive layer 120 and the negative conductive layer 130.

Figure 12:
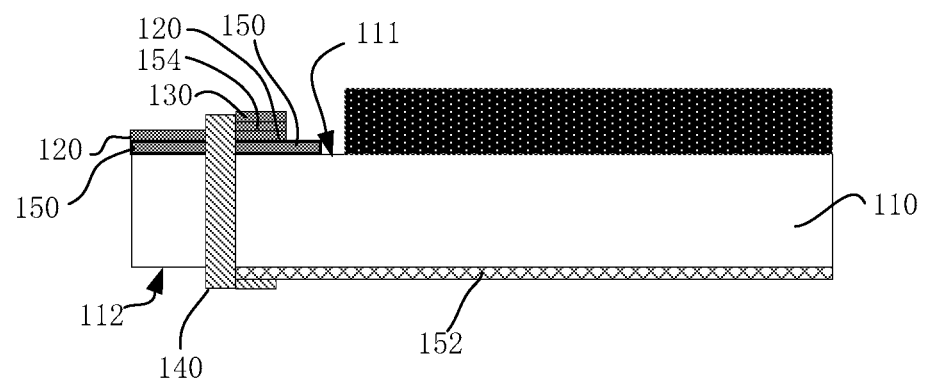
FIG. 12 is a schematic diagram of a cooler of a semiconductor laser of a third embodiment of the invention at a third angle of view.

Optionally, in FIG. 12, the positive conductive layer 120 and the negative conductive layer 130 may be stacked. The positive conductive layer 120 and the negative conductive layer 130 are disposed at different layers, and a second insulation layer 154 is disposed between the positive conductive layer 120 and the negative conductive layer 130, to ensure the insulation of the positive conductive layer 120 and the negative conductive layer 130.

For the stacked positive conductive layer 120 and negative conductive layer 130, the positive conductive layer 120 may be close to one end of the heat sink 110, and the first insulation layer 150 is disposed between the heat sink 110 and the positive conductive layer 120, as shown in FIG. 12. The arrangement is similar to the arrangement of the insulation member between the first electrical and thermal conductive layer and the negative conductive layer in the first embodiment. In this embodiment, the laser chip is disposed on a region of the positive conductive layer 120 corresponding to the arrangement position of the negative conductive layer. In the aforesaid first embodiment, the region of the first electrical and thermal conductive layer where no negative conductive layer is disposed can be provided with a laser chip. Preferably, in this structure, the area of the positive conductive layer 120 is larger than the area of the negative conductive layer 130 in the stacked structure, and the positive conductive layer 120 is located between the negative conductive layer 130 and the heat sink 110, so that the area where the positive conductive layer 120 and the negative electrode conductive layer 130 are not stacked can be used to load the laser chip, and the side of the negative conductive layer 130 away from the positive conductive layer can be used for connecting to the negative electrode of the laser chip.

In addition, in this embodiment, when the positive conductive layer 120 and the negative conductive layer 130 are in different layers, it is practicable that the negative conductive layer 130 is close to the heat sink 10. The first insulation layer is disposed between the heat sink and the negative conductive layer, and the second insulation layer is disposed between the negative conductive layer 130 and the positive conductive layer 120. Under this structure, it is preferable that the area of the negative conductive layer is larger than the area of the positive conductive layer.

In certain embodiments, the negative conductive layer 130 may be a copper piece, or a copper piece is disposed on the negative conductive layer 130 to electrically connect to the negative electrode of the laser chip.

As an improvement, in certain embodiments, the first surface 111 of the heat sink 110 can include a first portion and a second portion. As shown in FIG. 10 and FIG. 12, the first portion may be one end of an extension direction of the longer side of the first surface 111 of the heat sink 110, and the positive conductive layer 120 and the negative conductive layer 130 are disposed in the first portion. A fourth insulation layer 156 is disposed in the second portion. The height of the fourth insulation layer 156 is slightly higher than the height of other devices disposed on the heat sink 110. And, when the laser chip is disposed on the positive conductive layer 120 and the negative electrode of the laser chip is electrically connected to the negative conductive layer 130, the height of the fourth insulation layer 156 may still be slightly higher than the height of other devices including the laser chip and the electrical connection lines. It should be understood that the height of the fourth insulation layer 156 refers to the distance between the surface of the fourth insulation layer 156 away from the heat sink 110 and the heat sink 110. In addition, when the first insulation layer 150 is disposed on the first surface 111 of the heat sink 110, the fourth insulation layer 156 may be an insulation layer on the second portion of the first surface 111, corresponding to the first insulation layer 150.

As shown in FIG. 10, in this embodiment, the conductive connector 140 comprises a first end part 146, a second end part 148, and a first connection part 142 connecting the first end part and the second end part.

Specifically, as shown in FIGS. 10 and 11, the first end part 146 is disposed on the positive conductive layer 120, and specifically disposed on the surface of the positive conductive layer 120 away from the heat sink 110, and the second end part 148 is disposed on a second surface 112 of the heat sink 110 away from the first surface 111. The second end part is insulated from the heat sink. The first connection part is disposed at a non-opposite end of the positive conductive layer on the heat sink. When the cooler of the semiconductor laser is provided with a laser chip to form a semiconductor laser, the first connection part is not at the opposite end of the laser chip. The non-opposite end of the positive conductive layer on the heat sink is not at the opposite end of the positive conductive layer on the heat sink. For example, the heat sink includes one end and the other end opposite to each other, and one end is provided with the positive conductive layer, then the first connection part is not disposed at the other end. When the second surface 112 of the heat sink is provided with a third insulation layer 152, the second end part 148 of the conductive connector 140 may be disposed on one side of the third insulation layer 152 away from the first surface 111, so that the second end part 148 is insulated from the heat sink 110. The second end part can serve as a second electrical and thermal conductive layer disposed on the third insulation layer.

Furthermore, as shown in FIG. 10, the first end part and the second end part are staggered. When a plurality of semiconductor lasers prepared by the semiconductor laser cooler of the disclosure form a stack, the second end part is in contact with the negative conductive layer of the adjacent semiconductor laser, and is insulated from the positive conductive layer of the adjacent semiconductor laser.

Optionally, the second end part can be disposed on a region of the second surface corresponding to the negative conductive layer, so that when a plurality of semiconductor lasers is stacked, the second end part of the semiconductor laser is electrically connected to the negative conductive layer of the adjacent semiconductor laser, and is insulated from the positive conductive layer of the adjacent semiconductor laser.

Figure 13:
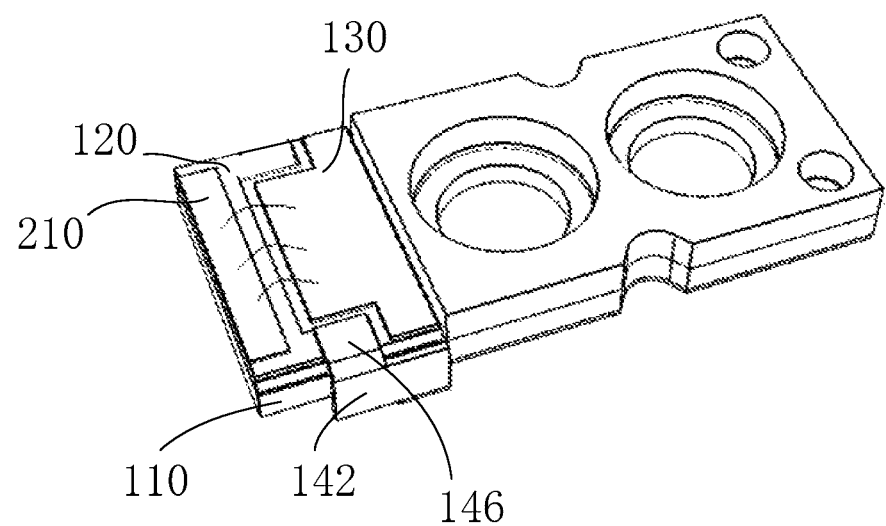
FIG. 13 is a schematic diagram of a cooler of a semiconductor laser of a third embodiment of the invention at a fourth angle of view.
Figure 14:
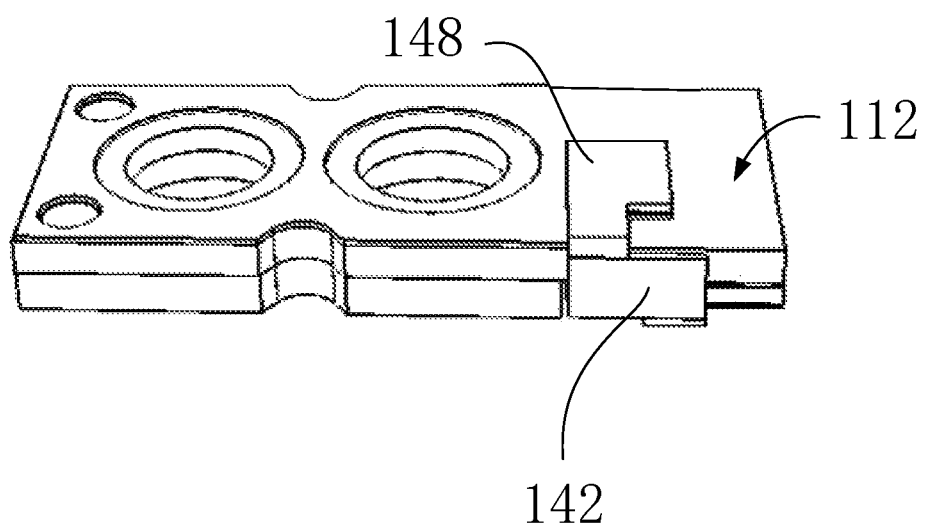
FIG. 14 is a schematic diagram of a cooler of a semiconductor laser of a third embodiment of the invention at a fifth angle of view.

As shown in FIGS. 11, 13 and 14, take a rectangular three dimensional heat sink as an example, the extension direction of the first end part 146 and the second end part 148 is consistent with the extension direction of the shorter side of the first surface 111, and the lengths of the first end part 146 and the second end part 148 are limited in this embodiment. The distance between the first end part 146 and the second end part 148 is also not limited. In this embodiment, the first end part 146 may be made as short as possible as long as the conductive connector 140 is stably disposed on the heat sink 110. For example, the length of the first end part 146 is half of the shorter side of the first surface 111 of the heat sink 110.

As shown in FIG. 10, the first connection part 142 is opposite to and insulated from the side faces of the heat sink 110 between the first surface 111 and the second surface 112. Specifically, the heat sink is an insulating material, so that the heat sink is insulated from the first connection part; or there is a gap between the heat sink and the first connection part, so that the heat sink is insulated from the first connection part; or an insulation layer is disposed between the heat sink and the first connection part, so that the heat sink is insulated from the first connection part.

Figure 15:
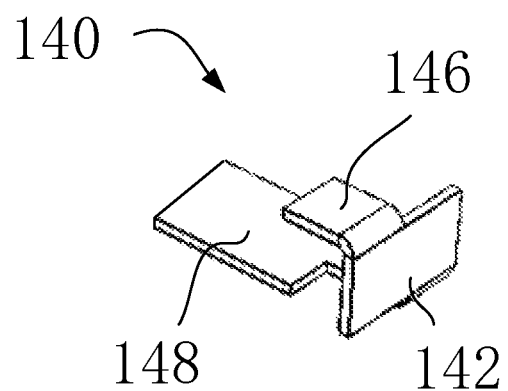
FIG. 15 is a schematic diagram of a conductive connector of a cooler of a semiconductor laser of the invention.

The connection line between the first end part 146 and the first connection part 142 is located on the longer side of the first surface 111 of the heat sink 110, and the connection line between the second end part 148 and the first connection part 142 is located on the longer side of the second surface 112 of the heat sink 110. As shown in FIG. 15, a C-shaped structure can be formed between the first end part 146, the first connection part 142, and the second end part 148. The opening direction of the C-shaped structure extends toward the shorter side of the first surface 111 of the heat sink 110, and the opening direction is towards one end of the heat sink which is the non-opposite end of the positive conductive layer of the heat sink, and can be the end adjacent to one end of the heat sink where the positive conductive layer is disposed, as shown in FIG. 14. As shown in FIG. 13, in this embodiment, the opening direction of the C-shaped structure of the conductive connector can be different from that in embodiment 1 and embodiment 2. The opening direction of the conductive connector in embodiment 1 and embodiment 2 is towards the end where the positive conductive layer is disposed; after the semiconductor laser is formed, the opening direction of the conductive connector in embodiment 1 and embodiment 2 is towards the laser chip. The bended end part of the conductive connector is at the opposite end of the laser chip. In this embodiment, one end of the heat sink facing the opening direction of the conductive connector of the C-shaped structure is the end adjacent to one end of the positive conductive layer. The first connection part of the conductive connector is located at the adjacent end of the positive conductive layer. After the semiconductor laser is formed, the opening direction of the conductive connector faces the adjacent end of the positive conductive layer. As shown by the direction of the straight arrow in FIG. 11, the direction in which the shorter side extends and the direction of the shorter side are from one longer side of the first surface to the other longer side.

In this embodiment, the conductive connector 140 is greater than or equal to 1 in number, preferably, 2. When two C-shaped conductive connectors 140 as shown in FIG. 15 are employed, the two C-shaped conductive connectors 140 face one another, that is to say, the first connection parts 142 of the two conductive connectors 140 are parallel to each other in the extending direction of the shorter side of the first surface or the second surface of the heat sink 110.

Figure 16:
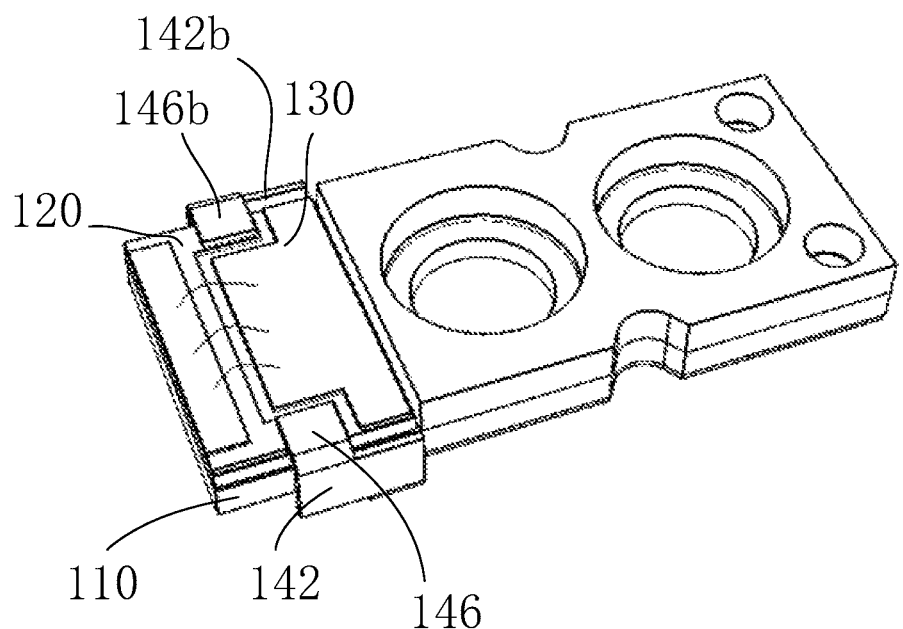
FIG. 16 is another schematic diagram of a cooler of a semiconductor laser of a third embodiment of the invention at one angle of view.

As an improvement, in this embodiment, as shown in FIG. 16, the conductive connector 140 further comprises a third end part 146b and a second connection part 142b; the third end part 146b is disposed on the positive conductive layer; the first end part 146 and the third end part 146b are correspondingly disposed along the extension direction of the second end part; the third end part and the second end part are staggered. When the second end part extends along the shorter side of the first surface, referring to FIG. 16, the first end part 146 and the third end part 146b are oppositely disposed along the shorter side of the first surface 111.

As an improvement, as shown in FIG. 16, the first end part 146 and the third end part 146b are oppositely disposed on two ends of the heat sink, respectively. The two opposite ends are located on the two longer sides. The first end part 146 and the third end part 146b both correspondingly extend along the shorter sides of the first surface 111. The first end part 146 extends from the longer side of the first surface 111 to the third end part, and the third end part 146b extends from the longer side of the first surface to the first end part 146. The first end part 146 and the third end part 146b are both arranged on the positive conductive layer 120.

Figure 17:
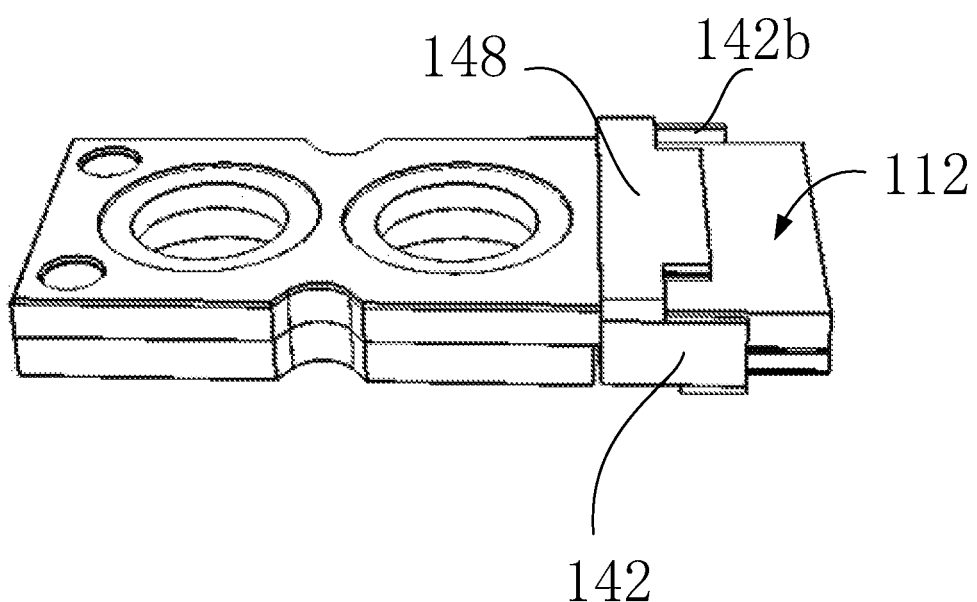
FIG. 17 is another schematic diagram of a cooler of a semiconductor laser of a third embodiment of the invention at another angle of view.
Figure 18:
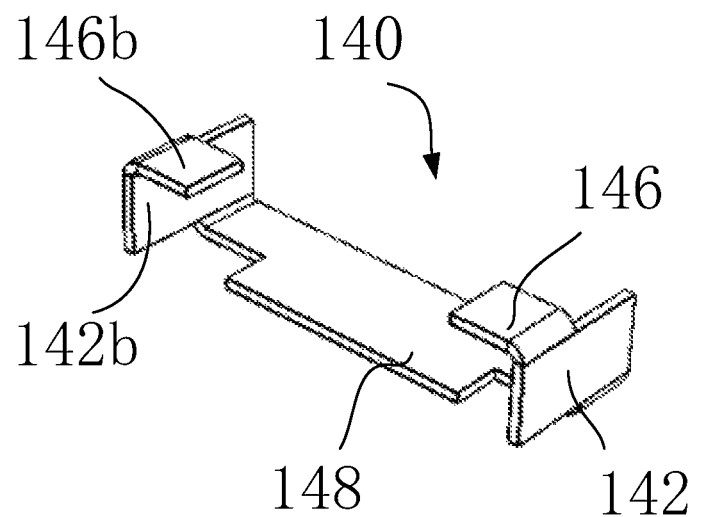
FIG. 18 is another schematic diagram of a conductive connector of a cooler of a semiconductor laser of the invention.

As shown in FIGS. 17 and 18, the first connection part 142 and the second connection part 142b are oppositely disposed along the extension direction of the second end part. When the second end part extends along the direction of the shorter side of the first surface 111, the first connection part 142 and the second connection part 142b are oppositely disposed along the direction of the shorter sides of the first surface 111, respectively, are opposite to two sides corresponding to the longer side of the first surface 111, respectively, and are insulated from the two sides. The second end part 148 extends along the direction of the shorter side of the first surface 111, from one of the longer sides of the second surface 112 to the other longer side of the second surface 112. Specifically, the second end part can, in the region of the second surface corresponding to the location of the negative conducting layer, extend in any way from one longer side of the second surface 112 to the other longer side of the second surface 112. In a certain specific embodiment, as shown in FIG. 17, the shape of the second end part can be the same as that of the negative conductive layer, or slightly less than that of the negative conductive layer, and the second end part is disposed in the area of the second surface of the heat sink corresponding to the location of the negative conductive layer.

Two ends of the second end part 148 are connected to the first connection part 142 and the second connection part 142b, respectively. The first end part 146 and one end of the second end part 148 are connected through the first connection part 142, and the third end part 146b and the other end of the second end part 148 are connected through the second connection part 142b, to form the U-shaped conductive connector 140 as shown in FIGS. 17 and 18, so that the U-shaped conductive connector 140 can be stably disposed on the heat sink 110. As shown in FIG. 17, the opening direction of the U-shaped conductive connector 140 is toward the first surface 111 of the heat sink 110, specifically, the direction of the shortest connection line between the second surface 112 and the first surface 111.

In this embodiment, when the conductive connector 140 and the cooler 100 of the semiconductor laser are used for preparing a stack of semiconductor lasers, the first end part 146 of the conductive connector 140 is electrically connected to the positive conductive layer 120, so that the second end part 148 is electrically connected to the positive conductive layer 120. When the second end part 148 of one semiconductor laser is in contact with the negative area of another semiconductor laser, the positive conductive layer 120 of the one semiconductor laser is electrically connected to the negative conductive layer 130 of the other semiconductor laser through the conductive connector 140. Actually, in this embodiment, the structure of the electrode connector 140 is not limited on the basis that the positive conductive layer 120 of one semiconductor laser can be electrically connected to the negative conductive layer 130 of another semiconductor laser.

The semiconductor laser cooler 100 of the disclosure can be used to prepare a semiconductor laser 200. The semiconductor laser 200 comprises a laser chip 210 and the semiconductor laser cooler 100. As shown in FIGS. 13-19, the laser chip 210 is disposed on the positive conductive layer 120 of the semiconductor laser cooler 100. The positive electrode of the laser chip 210 is electrically connected to the positive conductive layer 120. The positive electrode of the laser chip 210 may be bonded to the positive conductive layer 120 by a solder. The position where the laser chip 210 is disposed on the positive conductive layer 120 is preferably a region, which is not in contact with the first end part 146 of the conductive connector 140, of the positive conductive layer 120.

Figure 19:
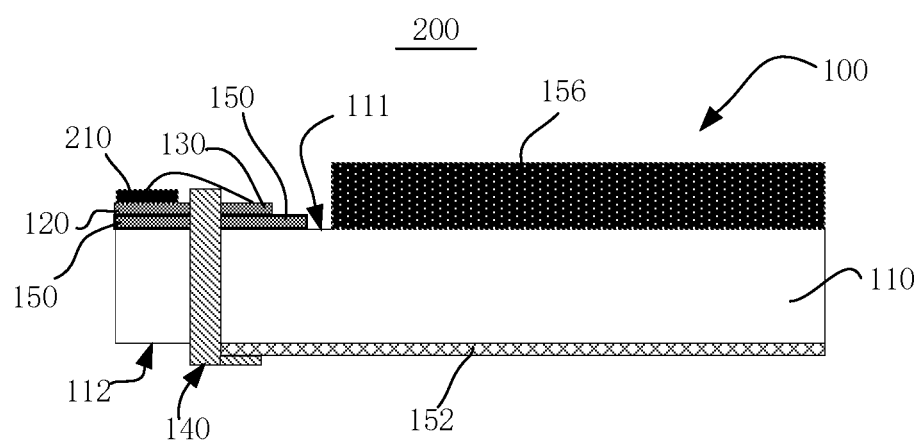
FIG. 19 is a schematic diagram of a semiconductor laser of a third embodiment of the invention.

Specifically, the negative electrode of the laser chip 210 is electrically connected to the negative conductive layer 130 of the semiconductor laser cooler 100. As shown in FIGS. 13 and 19, the laser chip 210 and the negative conductive layer 130 may be electrically connected by a conductive metal wire, such as a gold wire. And, as shown in FIG. 19, the greatest height of the connection line is lower than the height of the fourth insulation layer 156 of the semiconductor laser cooler 100. Optionally, in this embodiment, the connection mode between the negative electrode of the laser chip 210 and the negative conductive layer 130 of the semiconductor laser cooler 100 is not limited. Alternatively, the negative electrode of the laser chip 210 may be electrically connected to the negative conductive layer 130 in other ways.

In the fabrication of the semiconductor laser 200 provided in the present embodiment, the positive electrode of the laser chip 210 can be bonded to the positive conductive layer 120 disposed on the heat sink 110 by a solder, and the negative electrode of the laser chip 210 can be electrically connected to the negative conductive layer 130 disposed on the heat sink 110 by a conductive wire.

Figure 20:
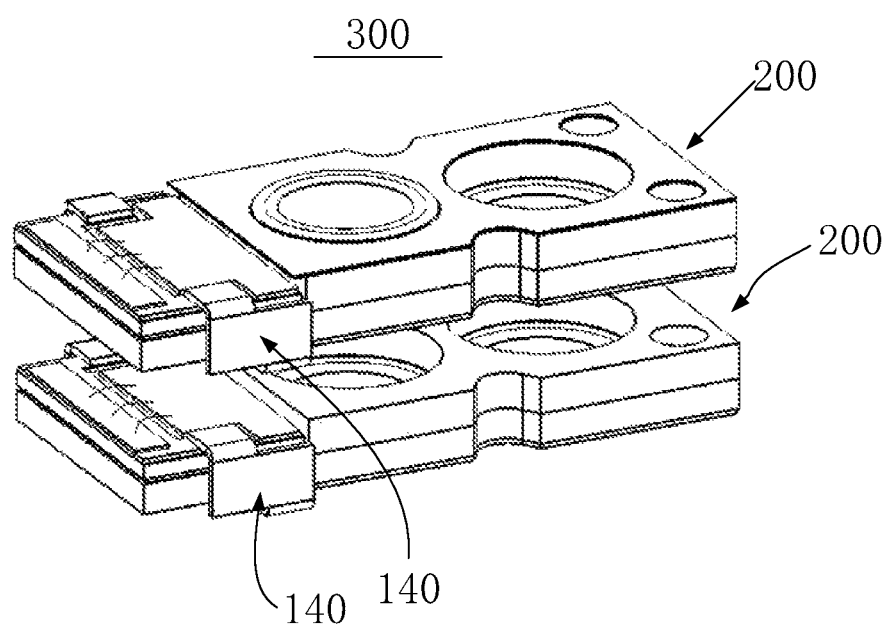
FIG. 20 is a schematic diagram of a stack of semiconductor lasers according to one embodiment of the invention.

A semiconductor laser stack 300 is illustrated in FIG. 20, comprising a plurality of semiconductor lasers 200 provided by the present embodiment. The plurality of semiconductor lasers 200 are sequentially stacked along the connection direction of the laser chips on the first surface 111 and the second surface 112 of the heat sink 110, as shown in FIG. 20, and electrically connected through the conductive connectors 140.

Specifically, among the plurality of semiconductor lasers 200 stacked in a stack, between two adjacent semiconductor lasers 200, the first end part 146 of the conductive connector 140 of the first semiconductor laser 200 is electrically connected to the positive conductive layer 120. Since the second end part 148 communicates with the first end part 146 through the first connection part 142, and communicates with the third end part 146b through the second connection part 142b, the second end part 148 of the second surface 112 of the heat sink 110 is electrically connected to the positive conductive layer 120. Specifically, when two adjacent semiconductor lasers 200 are stacked, the second end part 148 of the first semiconductor laser 200 is in contact with the negative conductive layer of the adjacent second semiconductor laser 200, avoiding the metal connection line connecting the negative conductive layer to the laser chip 210 and maintaining insulation from the positive conductive layer of the adjacent second semiconductor laser 200. The positive conductive layer 120 of the first semiconductor laser 200 and the negative conductive layer 130 of the second semiconductor laser 200 are electrically connected through the conductive conductor 140. Understandably, FIG. 20 shows only the superposition of two semiconductor lasers 200. In this embodiment, the superposition of the semiconductor laser 300 may involve a plurality of semiconductor lasers 200, the specific number of which is not limited in this embodiment.

When a plurality of semiconductor lasers 200 are stacked in the semiconductor laser stack 300, the insulation layers disposed on the surfaces of the heat sinks 110 can ensure the insulation between the heat sinks 110 of the semiconductor lasers 200.

When a fourth insulation layer 156 is disposed on the first surface 111 of the heat sink 110 of the semiconductor laser 200, the fourth insulation layer 156 slightly higher than the height of other devices mounted on the heat sink 110 prevents the conductive metal wire between the laser chip 210 and the negative conductive layer 130 of the semiconductor laser 200 from being pressed by other devices. Furthermore, in two adjacent semiconductor lasers 200, the fourth insulation layer 156 is only slightly higher, enabling the second end part 148 of one conductive conductor 140 to be electrically connected to the negative conducting layer 130 of the other semiconductor laser 200.

Embodiment 4

The embodiment provides a conductive connector applied to the semiconductor laser cooler, or the semiconductor laser, or a semiconductor laser stack in the aforesaid embodiments. As shown in FIGS. 2 7, 15 and 18, the conductive connector comprises a first end part, a second end part and a first connection part connecting the first end part and the second end part. The extension directions of the first end part and the second end part are the same, and perpendicular to the extension direction of the first connection part.

The specific structure of the conductive connector can refer to the aforesaid embodiments, which is not described herein.

It should be noted that the emphasis of each embodiment in this specification may be different. Each embodiment highlights the differences with other embodiments, and the same and similar parts of each embodiment can be referred to each other.

In this document, relational terms such as first and second are used merely to distinguish one entity or operation from another entity or operation, and do not necessarily require or imply any such actual relationship or order. Furthermore, the term "comprise" or "comprises" or "comprising" or any other variants thereof is intended to encompass a non-exclusive inclusion, such that a process, method, article, or device that comprises a plurality of elements including not only those elements but also other elements, or elements that are inherent to such a process, method, item, or device. An element defined by the phrase "comprising a . . . " without further limitation does not exclude the existence of additional identical elements in the process, method, article or device including the element.

The above description is only a preferred embodiment of the application and is not intended to restrict the application. For technical personnel in the field, the application may be subject to various changes and variations. Any modification, equivalent replacement, improvement, etc. made in the spirit and principles of this application shall be included in the scope of protection of this application. It should be noted that similar labels and letters indicate similar terms in the attached figure below, so that once an item is defined in an attached figure, it is not necessary to further define and interpret it in subsequent attached figures.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A cooler of a semiconductor laser, comprising:
   a heat sink comprising a first surface and a second surface opposite the first surface;
   a first conductive layer and a second conductive layer, disposed on the first surface and not short-circuited to each other; and
   a conductive connector comprising a first end part, a second end part, and a first connection part connecting the first end part and the second end part;
   wherein the first end part is on the first conductive layer;
   wherein the second end part is on the second surface of the heat sink and insulated from the heat sink;
   wherein the first connection part is disposed at a first non-opposite end of the first conductive layer on the heat sink;
   wherein the conductive connector further comprises a third end part, and a second connection part connecting the third end part and the second end part;
   wherein the third end part is on the first conductive layer;
   wherein the second connection part is at a second non-opposite end of the first conductive layer on the head sink; and
   wherein the second non-opposite end is opposite from the first non-opposite end.

2. A semiconductor laser, comprising a laser chip and the cooler of claim 1;
   wherein the laser chip is on the first conductive layer, a positive pole of the laser chip is electrically connected to the first conductive layer, and a negative pole of the laser chip is electrically connected to the second conductive layer.

3. A system comprising a first semiconductor laser of claim 2 and a second semiconductor laser of claim 2; wherein the first semiconductor laser is stacked on the second semiconductor laser; wherein the second end part of the conductive connector of the first semiconductor laser contacts the second conductive layer of the second semiconductor laser.

4. The cooler of claim 1, wherein the first end part and the second end part are staggered.

5. The cooler of claim 1, wherein an orthographic projection of the first end part onto the second surface of the heat sink and an orthographic projection of the second end part onto the second surface of the heat sink do not overlap.

6. The cooler of claim 1, wherein an orthographic projection of the second end part onto the second surface of the heat sink is within an orthographic projection of the second conductive layer onto the second surface of the heat sink.

7. The cooler of claim 1, further comprising a first insulation layer on the first surface of the heat sink; wherein the first insulation layer is configured to insulate the first conductive layer and the second conductive layer from the heat sink.

8. The cooler of claim 7, further comprising a second insulation layer on the first surface of the heat sink; wherein the second insulation layer is not in direct contact with the first insulation layer.

* * * * *